United States Patent [19]

Lindmayer

[11] 4,082,568
[45] Apr. 4, 1978

[54] SOLAR CELL WITH MULTIPLE-METAL CONTACTS

[76] Inventor: Joseph Lindmayer, 1335 Piccard Dr., Rockville, Md. 20850

[21] Appl. No.: 795,550

[22] Filed: May 10, 1977

[51] Int. Cl.$^2$ ............................................. H01L 31/06
[52] U.S. Cl. .......................... 136/89 CC; 204/192 C; 357/30; 357/67; 427/89
[58] Field of Search ..................... 136/89 CC; 427/89; 357/67, 30; 204/192 C, 192 EC

[56] References Cited

U.S. PATENT DOCUMENTS

| | | | |
|---|---|---|---|
| 3,106,489 | 10/1963 | Lepselter | 117/217 |
| 3,434,885 | 3/1969 | Mandelkorn et al. | 136/89 |
| 3,664,874 | 5/1972 | Epstein | 136/89 |
| 3,686,036 | 8/1972 | Gereth et al. | 136/89 |
| 3,736,180 | 5/1973 | Fischer et al. | 117/217 |
| 4,025,404 | 5/1977 | Joly et al. | 204/38 B |

OTHER PUBLICATIONS

W. W. Lloyd "Fabrication of an Improved Vertical Multijunction Solar Cell," *Conf. Record, 11th IEEE Photospecialists Conf* (1975), pp. 349-355.

R. L. Crabb et al., "Environmental Assessment of Thin Silicon Solar Cells from Pilot Production," *Conf. Record, IEEE Photospecialists Conf.* (1968), pp. 161-173.

H. J. Hovel, "Semiconductors & Semimetals–vol. 11 Solar Cells," Academic Press, N.Y., (1975), pp. 207-210.

H. Fischer et al., "New Aspects for the Choice of Contact Materials for Silicon Solar Cells," *Conf. Record, IEEE Photospecialists Conf.* (1968), pp. 70-76.

R. Gereth et al., "Contribution to Silicon Solar Cell Technology" *Energy Conversion*, vol. 12, pp. 103-107 (1972).

H. Fischer et al., "Electrochemically Passivated Contacts for Silicon Solar Cells" *IEEE Trans. Electron Dev.*, vol. ED-18, pp. 459-464, (1971).

*Primary Examiner*—Aaron Weisstuch

[57] ABSTRACT

Solar cell having a contact formed from a titanium group element in contiguous relationship with the cell, a mixture of a titanium group element and a platinum group element overlying the titanium group layer, and a layer of a platinum group element overlying that layer. A body of silver or other contact metal is adhered to the platinum group layer. The three layers may be vapor deposited on the semiconductor body, while the silver layer is more advantageously applied by plating or electroplating.

5 Claims, No Drawings

SOLAR CELL WITH MULTIPLE-METAL CONTACTS

The present invention relates generally to a new and novel contact to be used in conjunction with a body of semiconductor material. In particular, the contact, which is utilized to accept and direct a flow of electricity away from the solar cell, is of the multi-layered type in which various metals are adhered to each other and in which the properties of each metal are utilized so that the resulting contact is one that possesses advantages over a contact formed from any one of the multiplicity of metals utilized.

It has long been recognized that silver is an excellent conductor of electricity and makes an excellent contact for semiconductor devices. Thus, front and/or back contacts for solar energy cells are advantageously formed at least in large part from silver so that, particularly in the case of a front contact, a body of silver will extend in the form of a grid across the front face of the cell. This grid has the function of collecting electrons that have been formed by the *n-p* cell when the front surface thereof is exposed to light. These electrons will then migrate to the silver and will be conducted by the silver grid across the front surface of the cell to bussbars or other suitable means for directing the electrons away from the cell. A back contact for solar cells serves a complementary function, except that it need not extend in any particular pattern across the back surface of the cell that is not exposed to light. The back contact generally operates to close the electrical circuit brought into existence by the impingement of light on the front surface of the cell.

Silver, and to a lesser extent because of its increased price, gold, have been preferred as contact-forming materials for solar cells and other semiconductor devices. However, nickel, copper and solder are also suitable for use as contacts. The problem arises how to apply the silver to the surface of the cell in such a manner that it will be firmly adhered thereto. Further, since silver is a relatively expensive metal, it would be far more economic to apply the silver in a particular pattern by a method such as plating or electroplating, that is, by a method in which the silver is applied only to the certain areas of the cell surface on which conductivity is desired. Such methods as plating and electroplating are to be contrasted with vapor deposition, in which a layer of silver is applied indiscriminately on all portions of apparatus and, in common use, a shadow mask, as well as those portions of the cell surface where the actual deposition is desired. Since silver is not easily adhered to a silicon body, the art appears to have made efforts to interpose other metals between the silicon and the silver, although, at least in the art that is believed most pertinent, those who have previously designed such multiple metal contacts do not appear to have recognized that an important advantage of a multiple-metal contact is that the silver and other contact metals may be plated or electroplated onto certain metals, thereby enabling such mass of silver to be utilized as will serve as an efficient electrical contact, but preventing the waste of silver that occurs when a process such as vapor deposition is used.

It is, therefore, a primary object of the present invention to provide a solar energy cell in which a silver contact may be plated or electroplated to the front or back surfaces of the cell, or both such surfaces, without applying the silver to the entirety of such surfaces. Such object is accomplished as part of a contact that will be corrosion resistant to a high degree.

Titanium has been known by those of skill in this art to have ready adherence to silicon and other semiconductor materials. However, it has also been known that silver cannot be plated directly on titanium. Silver can be plated, or electroplated, or applied by other non-wasteful methods directly to palladium and platinum, which hereinafter will be collectively referred to as elements of the platinum group. Titanium, for the purposes of the present invention, has much in common with and can often be substituted by chromium, molybdenum, and tantalum. The elements, titanium, chromium, molybdenum, and tantalum, will hereinafter be referred to as those of the titanium group, for ease of reference. So, since titanium has the proper adherence to silicon, and platinum is platable or solderable, one possible solution to the economic use of silver as a contact for a semiconductor material would appear to be the use of a multilayer metal contact in which a member of the titanium group is in contact with the semiconductor body. A member of the platinum group would then overlie the titanium group layer, and the silver would be evaporated onto the platinum group layer. Although the patent is by no means entirely clear, U.S. Pat. No. 3,686,036 is issued on Aug. 22, 1972 in the names of Gereth and Fischer, appears to recognize the desirability of utilizing titanium in contact with semiconductor material, then a layer of a platinum group metal, and finally a layer of silver vapor deposited on the layer of platinum or palladium. However, this disclosure misses the entire advantage that may be obtained from the use of platinum or palladium as an intermediate material, i.e., that platinum or palladium is platable with silver and that the silver may be applied to the platinum or palladium layer not by the wasteful process of vapor deposition, which is specifically disclosed in said U.S. Pat. No. 3,686,036. Further, by vapor deposition, the thicker the layer of silver that is desired to be applied — and considerable amounts of silver are required in order to provide the necessary mass for the conduction of electricity away from the solar cell — the more silver will be wasted by vapor deposition in which the relatively thick layer of silver is applied indiscriminately over a large area.

Additionally, a problem that does not appear to have been recognized by the prior art is that there are problems of adherence between the titanium group layer and the platinum group layer that overlies it. Specifically, definite problems have arisen when a layer of titanium is layed down in adherence to silicon by vapor deposition and then a layer of palladium vapor deposited on the layer of titanium. I have, by the present invention, found a way to overcome that lack of adherence, and in so doing to form contacts in which each of the multi-metal layers will be firmly adhered to its contiguous layer, and in which the entire contact will be well adhered to the semiconductor body. Further, the present invention provides a metal contact in which silver or other contact metal in a substantial body forms the upper, i.e., outwardly facing portion of the contact and in which the silver may be applied to the remainder of the contact by a method that is economic, i.e., in which the silver is applied only to those portions on which it is to remain permanently in performance of its contact function.

Precisely, according to the present invention, I provide a solar energy cell in which a multimetal contact comprises a layer of titanium group metal adhered to the cell; a layer of a mixture of a titanium group element and a platinum group element overlies that first layer. Still a third layer is formed by the platinum group element alone. Then, a body of silver or other contact metal which has substantially greater mass than any of the other layers, is firmly adhered to the platinum group layer, preferably by plating or electroplating. The titanium layer serves to provide firm adherence to the silicon body. The platinum layer serves as a metal on which the silver is readily platable. I have solved the problem of adherence between the titanium and platinum by interfacing the titanium and platinum layers with a layer comprising a mixture of both platinum and titanium. I have found that by providing such an interface layer, the normal problems of adherence between titanium and platinum is overcome, and that there is firm and lasting adherence between the titanium group and the platinum group metals. With such firm adherence, there is no difficulty in securing the platinum group metal indirectly to the body of the solar cell, and with the platinum group metal in position, there is no problem in applying a relatively large mass of silver directly on the platinum group layer by an economical means.

The above problems and their solutions will be further exemplified by reference to a specific example of a preferred embodiment of the method by means of which I produce the article of manufacture that constitutes one portion of the present invention. By that method I produce an electrically conductive grid on the front, light-impinging surface of a silicon solar cell in a specific pattern. The pattern generating means may be those which are known in the art, such as through the use of a shadow mask, which has the disadvantage of not being able to form a continuous pattern, or by photolithography, which is preferred. Of course, the surface of the cell will first have been cleaned to insure adherence of the metal to that surface. I prefer to use vapor deposition from a vacuum system to apply the titanium group, platinum group and mixture layers to the cell surface and to overlying layers. In such vapor deposition procedure, I have utilized a vacuum system marketed by Veeco Instruments, Inc., of Plainview, New York, which is referred to by that company as a High Vacuum Deposition System and is further identified by the designation Veeco VE7760. The Veeco high vacuum system has two sets of tungsten filaments to vaporize metals contained therein. So, in the preferred embodiment in my invention, I place a titanium source, i.e., titanium wire, in one of the filaments and palladium wire within the other filament. A vacuum is drawn, and deposition takes place at a pressure of about $10^{-5}$ Torr. When the desired pressure has been reached, the power is turned on to the filament containing the titanium and evaporation of the titanium is commenced. The titanium will be deposited on a plurality of solar cells that have been placed within the vacuum chamber. After a layer of titanium of about 500 to 600A in thickness had been deposited, the filaments containing the palladium were also activated and deposition continued with both sets of filaments activated so that simultaneously titanium and palladium in substantially equal atomic amounts were deposited. When a further layer of about 700 to 800A of the mixture of titanium and palladium had been deposited, the set of filaments containing the titanium were shut off and an additional layer of palladium alone was deposited in a thickness of about 500A. Then the entire vacuum system was deactivated. Now the solar cells were removed from the Veeco high vacuum deposition system and, where photolithography had been used, a fine pattern was defined having an exposed palladium layer.

An electroplating bath was now prepared utilizing a potassium silver cyanide formulation sold by Sel-Rex Co., of Nutley, New Jersey, under the trademark Silver SOL-U-SALT. The material was stated to contain 54% silver. An electroplating bath was prepared using the Sel-Rex potassium silver cyanide composition and the solar cells with their metal grids consisting of three layers, the outer layer being the palladium, were placed in the bath. It has been found that on exposure to air the palladium had acquired a light coating of palladium oxide. Consequently, the cells were immersed in the bath for a period of about 10 seconds, during which time the palladium oxide decomposed. Then the current was turned on and silver was plated from the Sel-Rex solution to a depth of about 6 to 10 microns. Such plating took place only at the palladium-surfaced grid and not at the remainder of the front surface of the solar cells. Since the depth of the silver was 6 to 10 microns, the mass of the silver was considerable compared to the layers of the other metals that form the electrically conductive grid. Such method of depositing silver has definite economic advantages over other methods of deposition, e.g., vapor deposition. Further, the body of silver that formed the main portion of the contacts was firmly adhered to the body of semiconductor material, since the titanium adhered well to the silicon, the palladium was firmly affixed to the titanium through the intermediation of an interface layer of titanium and palladium, and the palladium formed a good substrate on which the silver could be plated. The resulting contact was highly corrosion-resistant.

It will be apparent to those of skill in this art that certain alterations, modifications, and substitutions may be made in the preferred method and article produced thereby as described hereinbefore, and particularly in the specific embodiment of that method and article. Thus, in lieu of vapor deposition, the titanium group and platinum group layers, as well as the layer comprising a mixture of those elements, may be applied by means other than vapor deposition, e.g., by sputtering. In actual practice I have preferred vapor deposition with the Veeco apparatus because such deposition takes place in all directions rather than primarily in a specific direction; therefore, more solar cells can be coated in a single batch. Additionally, it will be apparent that the present invention is not to be limited to the application of silver, but some other contact metal, e.g., nickel, copper or even solder, may be substituted for the silver. Thus, plating or, as mentioned, even soldering techniques can be used to apply the contact metal or metals to the platinum group metal. Even vapor deposition can be used to apply the silver, although here the significant economic advantage of other means of application of silver to the platinum group metal will be forfeited. Consequently, as to all such obvious modifications, alterations and substitutions, it is intended that they be deemed to be included within the present invention, which is to be limited in scope only by the purview, including equivalents, of the following, appended claims.

I claim:

1. A solar cell comprising a body of semiconductor material and at least one contact adhered thereto for accepting and directing a flow of electricity away from said article, said contact comprising a first layer of an element from the titanium group in contiguous relationship with said article, a second layer comprising a mixture of a titanium group element and an element selected from the platinum group overlying said first layer, a third layer comprising an element from the platinum group overlying said second layer, and a body of contact metal overlying said third layer, each of said layers being in firm adherence to its adjoining layers.

2. A solar cell as claimed in claim 1, in which said first layer consists essentially of titanium.

3. A solar cell as claimed in claim 1, which said third layer consists essentially of palladium.

4. A solar cell as claimed in claim 1, in which said second layer comprises a mixture of titanium and palladium in substantially equal atomic amounts.

5. A solar cell as claimed in claim 1, in which said contact metal is silver.

* * * * *